United States Patent
Melnick et al.

[11] Patent Number: 6,107,136
[45] Date of Patent: Aug. 22, 2000

[54] METHOD FOR FORMING A CAPACITOR STRUCTURE

[75] Inventors: Bradley M. Melnick, Austin; Bruce E. White, Jr., Round Rock; Douglas R. Roberts; Bo Jiang, both of Austin, all of Tex.

[73] Assignee: Motorola Inc., Schaumburg, Ill.

[21] Appl. No.: 09/134,974

[22] Filed: Aug. 17, 1998

[51] Int. Cl.[7] .............................................. H01L 21/8242
[52] U.S. Cl. .......................... 438/253; 438/396; 257/306
[58] Field of Search ...................................... 438/240, 241, 438/239, 250, 256, 254, 253, 396; 257/306

[56] References Cited

U.S. PATENT DOCUMENTS

| 5,696,395 | 12/1997 | Tseng | 257/308 |
|---|---|---|---|
| 5,861,647 | 1/1999 | Zhao et al. | 257/296 |
| 5,892,282 | 4/1999 | Hong et al. | 257/751 |
| 5,907,772 | 5/1999 | Iwasaki | 438/253 |
| 5,909,621 | 6/1999 | Hsia | 438/254 |
| 5,968,851 | 10/1999 | Geha et al. | 438/756 |
| 5,972,722 | 10/1999 | Visokay et al. | 438/3 |
| 5,973,351 | 10/1999 | Kotecki et al. | 257/310 |
| 5,981,331 | 11/1999 | Tsumemine | 438/240 |
| 5,981,377 | 11/1999 | Koyama | 438/633 |

*Primary Examiner*—Tom Thomas
*Assistant Examiner*—Douglas W. Owens
*Attorney, Agent, or Firm*—Robert A. Rodriguez; Jeffrey S. Abel

[57] ABSTRACT

A dielectric film (110) is formed overlying a semiconductor device substrate (10). A dielectric post (204) having an outer peripheral boundary having sidewalls is formed over the dielectric film (110). A first conductive film (402) is deposited at least along the sidewalls of the dielectric post (204) to form a lower electrode. A capacitor dielectric film (1801) is deposited on the first conductive film, and a upper electrode (1802) is formed on the capacitor dielectric film (1801).

17 Claims, 6 Drawing Sheets

METHOD FOR FORMING A CAPACITOR STRUCTURE

RELATED APPLICATIONS

This application is related to U.S. Pat. application Ser. Nos. 09/058,935, filed Apr. 13, 1998; 09/064,076, filed Apr. 22, 1998; and 09/022,756, filed on Dec. 22, 1997, all of which are assigned to the current assignee hereof.

FIELD OF THE INVENTION

The present invention relates generally to a method for forming a semiconductor device, and more particularly, to a method for forming an electrode.

BACKGROUND OF THE INVENTION

Semiconductor devices continue to be scaled to smaller dimensions. The reduction in size of circuitry, such as capacitors in dynamic random access memory (DRAM) bit cells, has prompted a need to integrate high dielectric constant materials into the fabrication of such devices. Barium strontium titanium oxide (BST) and similar materials are high dielectric constant (high-k) materials currently being used as part of this integration scheme. However, these high-k materials may be incompatible with many commonly used electrode materials because they require high temperature anneals in oxygen or deposition at high temperatures in the presence of oxygen in order to achieve their desired electrical properties. The exposure to oxygen at high temperatures is problematic because it can result in an oxidation of the electrode. This, in turn, can produce changes in the electrical properties of the capacitor.

In order to minimize the problems associated with oxidation, materials that are resistant to oxidation at high temperatures and materials which form conductive oxides, such as platinum, iridium, palladium, ruthenium, osmium, and the like are being investigated for use in forming electrodes. However, current methods for forming electrodes using these materials are not without problems. Ruthenium is easily etched in an oxygen-containing plasma, however, one of the by-products, ruthenium oxide ($RuO_4$), is toxic. In addition, by-products of etchants commonly used to etch conductive materials, such as halogens, have low volatilities or are unstable when etching materials such as platinum, palladium, and iridium. This creates difficulties when etching these materials, particularly as the materials become thicker to accommodate higher aspect ratio features and as the spacing between the features decreases. That is, because such by-products have low volatility, they are not easily removed from high-aspect ratio structures.

Using high powered etching conditions and alternative processes, such as ion milling, to etch the thicker material, comes at the expense of selectivity loss and trenching of underlying films, as well as the formation of veils around the etched features. Trenching of underlying films is undesirable because of the impact it can have on device performance. Veils, or sidewall polymer, present a reliability concern. Their removal is difficult and is accomplished at the expense of lost time and additional processing steps. A need therefore exists to develop alternative manufacturing methods for forming conductive electrodes that are not susceptible to problems discussed hereinabove.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

The present invention relates generally to a method for forming a semiconductor device and a device formed thereby. In accordance with one embodiment of the present invention, a dielectric film is formed overlying a semiconductor device substrate. A dielectric post having an outer peripheral boundary having sidewalls is formed over the dielectric film. A first conductive film is deposited at least along the sidewalls of the dielectric post to form a lower electrode. A capacitor dielectric film is then deposited on the first conductive film, and a upper electrode is formed on the capacitor dielectric film.

In accordance with a second embodiment of the present invention, the semiconductor device includes a dielectric film overlying a semiconductor device substrate. A dielectric post having an outer peripheral boundary defined by sidewalls and a top surface, protruding from the dielectric film. A first conductive film on the dielectric post, at least along the sidewalls of the dielectric post, forming a lower electrode. A capacitor dielectric film on the first conductive film, and an upper electrode on the capacitor dielectric film.

Figure 1:
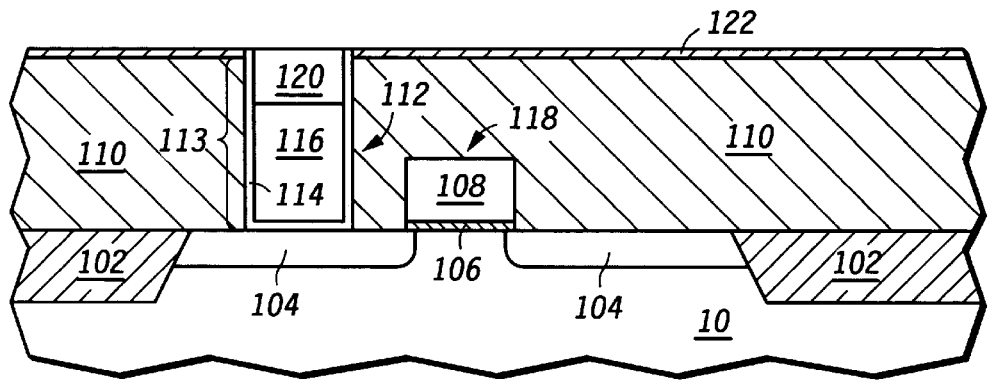
FIG. 1 includes an illustration of a cross-sectional view of a portion of a semiconductor device substrate after forming a conductive plug within a dielectric film.

FIG. 1 includes an illustration of a semiconductor device that has been partially processed to define a conductive plug. As shown, the partially processed semiconductor device includes a semiconductor device substrate 10, field isolation regions 102, a transistor 118, conductive plug 113, and a dielectric film 110. Transistor 118 comprises doped regions 104, a gate dielectric film 106, and a gate electrode 108. As used in this specification, the semiconductor device substrate 10 comprises a monocrystalline semiconductor wafer, a semiconductor-on-insulator substrate, or any other substrate used to form a semiconductor device.

In one embodiment, the gate electrode 108 is a layer of polysilicon. Alternatively, gate electrode 108 may be a metal layer, such as tungsten or molybdenum, a metal nitride layer, such as titanium nitride or tungsten nitride, or a combination thereof. In addition, gate electrode 108 may be a polycide layer comprising a metal silicide, such as tungsten silicide, titanium silicide, or cobalt silicide, overlying a polysilicon layer.

Following formation of the gate electrode 108, a dielectric film 110 is formed over the semiconductor device substrate 10 and patterned to form a contact opening. In one embodiment, dielectric film 110 is a layer of plasma deposited oxide that is formed using tetraethoxysilane (TEOS) as a source gas. Alternatively, dielectric film 110 may be a layer of silicon nitride, a layer of phosphosilicate glass (PSG), a layer of borophosphosilicate glass (BPSG), a silicon oxynitride layer, a polyimide layer, a low-k dielectric, or a combination thereof. Overlying dielectric film 110 is an adhesion/barrier layer 122. Adhesion/barrier layer 122 is typically formed using silicon nitride deposited to a thickness in a range of approximately 10–60 nanometers. Alternatively, adhesion/barrier layer 122 is formed as a layer of plasma enhanced nitride (PEN), silicon oxynitride, boron nitride, titanium oxide, tantalum oxide, other multicomponent oxides and nitrides, and the like. Adhesion/barrier layer 122 is optionally used as an etch stop layer during subsequent processing to form a capacitor electrode.

Following patterning, a contact opening is formed in the dielectric film 110 and adhesion/barrier layer 122. A conductive plug 113 is formed within the contact opening 112. Conductive plug 113 is formed using an adhesion/barrier film 114, such as titanium/titanium nitride (Ti/TiN), tantalum/tantalum nitride (Ta/TaN), and the like, a conductive fill material 116, such as tungsten or polysilicon, and the like, and an oxygen barrier material 120, such as iridium.

After deposition, portions of the conductive fill material 116 and underlying adhesion/barrier film 114 are removed using a conventional etch or chemical-mechanical polishing (CMP) process to form a conductive plug. Top portions of the conductive plug are then selectively etched back to form a recess in the contact opening. The etch is performed using a conventional etch process having adequate selectivity to the adhesion/barrier layer 122 to remove approximately 100–250 nanometers of the conductive plug material from the uppermost portion of the plug opening.

Approximately 350–550 nanometers of an oxygen barrier material is deposited over the top surface of the adhesion/barrier layer 122 and within the contact opening 112 to completely fill the contact opening 112. Typically, the oxygen barrier material 120 is formed using iridium. Alternatively, the oxygen barrier material 120 is formed using other conducting materials which may include noble metals, metals that are capable of forming conductive metal oxides, and conductive metal oxides and conductive metal nitrides. Examples of these include ruthenium (Ru), iridium oxide ($IrO_2$), ruthenium oxide($ReO_2$, $ReO_3$), titanium nitride (TiN), titanium aluminum nitride (TiAlN), titanium silicon nitride (TiSiN), tantalum nitride (TaN), tantalum aluminum nitride (TaAlN), tantalum silicon nitride (TaSiN), metal nitrides, metal borides, metal carbides, and the like. After deposition, portions of the oxygen barrier material 120 are removed using conventional etch or CMP processes to form the conductive plug 113. Up to this point in the process, conventional methods have been used to form the device as shown in FIG. 1.

Figure 2:
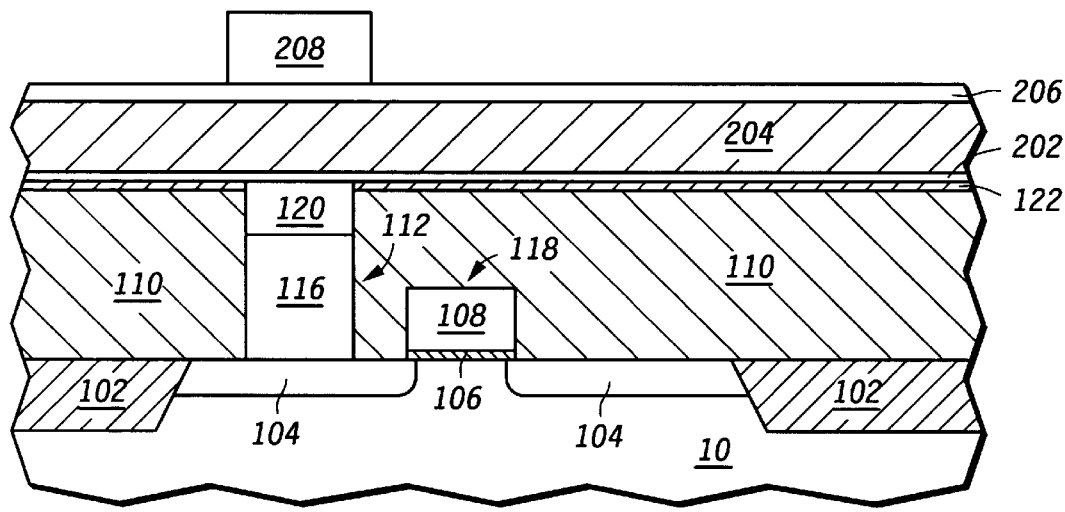
FIGS. 2–5 include an illustration of cross-sectional views of successive steps of the method of forming a capacitor according to one embodiment of the present invention.

FIG. 2 further illustrates the device in FIG. 1 and now includes a conductive film 202, a dielectric film 204, a conductive film 206, and a patterned photoresist layer 208. Conductive film 202 is formed overlying portions of the oxygen barrier material 120 and adhesion barrier layer 122. Typically, PVD sputtered iridium (Ir) is used to form the conductive films 202 and 206. However, conductive films 202 and 206 may alternatively be formed using other conducting materials which may include noble metals (platinum (Pt), palladium (Pd), and the like), metals that are capable of forming conductive metal oxides (ruthenium (Ru), rhenium (Re), rhodium (Rh), osmium (Os), and the like), conductive metal oxides (ruthenium oxide ($RuO_2$), rhenium oxide ($ReO_2$ $ReO_3$), iridium oxide ($IrO_2$), osmium oxide ($OsO_2$), and the like), or combinations thereof. Alloys or multiple conductive layers may be used also such as Pt-Ti, Pt-Pd, Pt-Ir, etc. Other examples include strontium ruthenate ($SrRuO_3$) lanthanum strontium cobalt oxide (LSCO) or yttrium barium copper oxide (YBCO). Conductive films 202 and 206 may also be formed using other deposition methods including CVD, electroplating, and electroless plating.

The thickness of conductive film 202 is in a range of approximately 20–50 nanometers. Overlying the conductive film 202 is dielectric material (dielectric film 204). Typically, the dielectric film 204 is formed as an undoped silicon oxide. The thickness of dielectric film 204 is approximately 250–450 nanometers. In one embodiment, the dielectric film 204 is formed using a chemical vapor deposition (CVD) process by reacting TEOS gas. Alternatively, dielectric film 204 may be formed using other deposition processes and with other materials. Examples of other materials include silicon nitride, silicon oxynitride, and the like. Overlying dielectric film 204 is conductive film 206. The thickness of conductive film 206 is in a range of approximately 50–100 nanometers. Overlying conductive film 206 is a photoresist layer 208. Photoresist layer 208 is patterned to define a portion of a bottom electrode of a capacitor.

Figure 3:
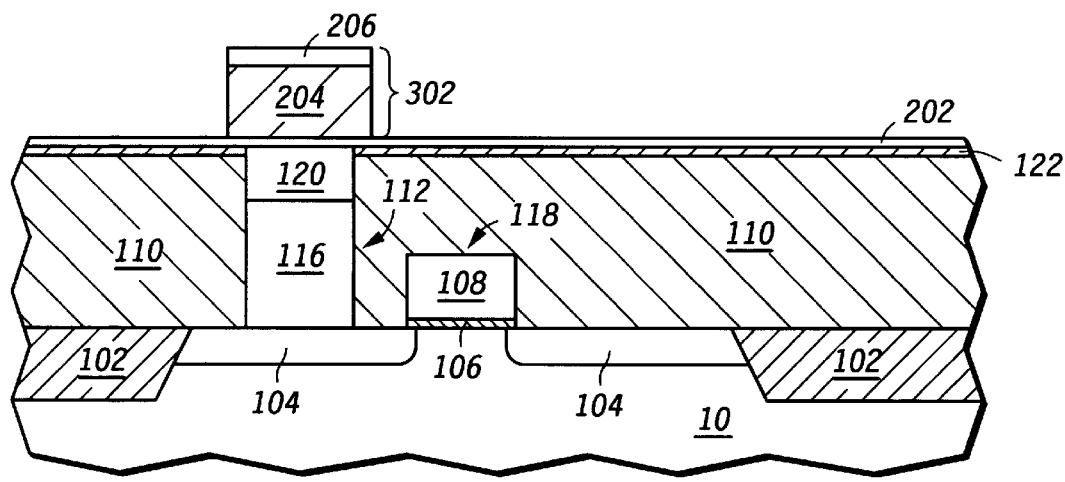

FIG. 3 illustrates the cross-section of the semiconductor device in FIG. 2 after being etched to form a dielectric post and conductive cap (post structure 302) from remaining portions of the conductive film 206 and the dielectric film 204. The post structure 302 can be formed using a multi-step etch process. The first step of the multi-step etch process uses a conventional halogen-containing plasma etch chemistry to remove the unpatterned portions of the conductive film 206. This etch step stops on or within the underlying dielectric film 204. Unlike in the prior art, wherein the entirety of films 204 and 206 is formed of the same conductive material, such as platinum, the thickness of the conductive film 206 is minimized such that it is now more easily etched. In addition, because the underlying dielectric film 204 is removed during the next etching step, concerns with selectivity control and trenching of the dielectric are also minimized.

The photoresist layer 208 (shown in FIG. 2) may optionally be removed using an intermediate oxygen containing etch processing step. Remaining portions of the conductive film 206 then function as a hardmask while etching the dielectric film 204. Subsequent removal of unpatterned portions of the dielectric film 204 is then accomplished using conventional carbon and fluorine containing dielectric etch processing chemistries. The etch processing step terminates upon removal of dielectric film 204 and exposure of conductive film 202 as illustrated in FIG. 3.

Figure 4:
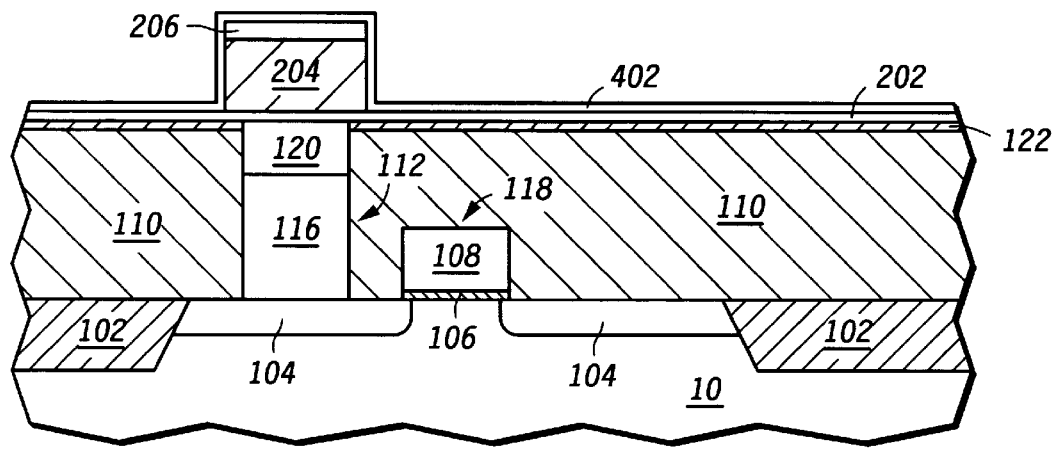

FIG. 4 further illustrates the cross-section of FIG. 3 and now includes a conductive film 402 deposited overlying conductive film 202, conductive film 206, and sidewall portions of dielectric film 204. The conductive film 402 is formed using materials and processes similar to those described to form conductive film 202. The thickness of conductive film 402 is in a range of approximately 10 to 70 nanometers.

Figure 5:
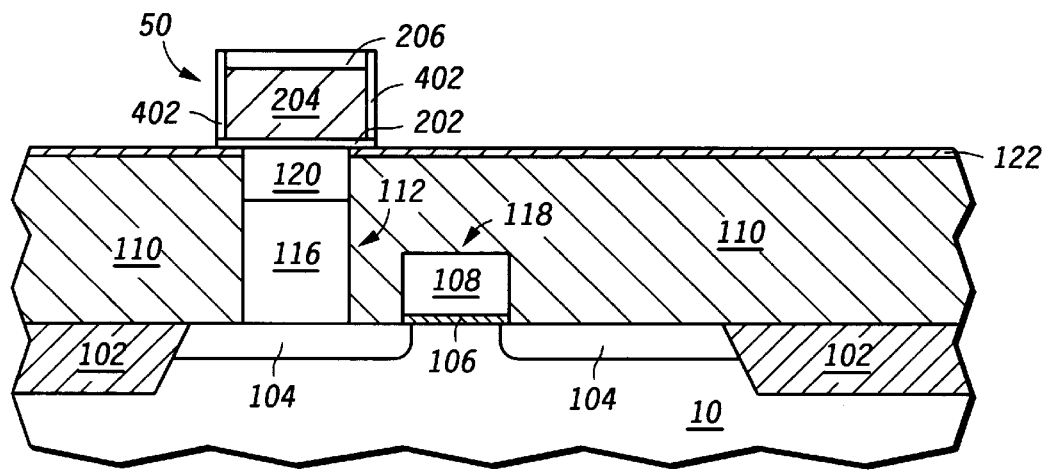

FIG. 5 illustrates the cross-section of FIG. 4 after removing portions of conductive films 402 overlying conductive film 206 and portions of conductive films 402 and 202 overlying adhesion/barrier layer 122. A conventional anisotropic etch, such as reactive ion etch (RIE) processing can be used to perform this etch. The overall time of the etch process is such that portions of conductive film 402 remain on the sidewalls of the dielectric film 204 after completing the etch. Those of ordinary skill in the art are capable of determining the appropriate overetch time for this processing step. Upon completion of the etch, a lower electrode 50 of a capacitor has been formed. The lower electrode 50 comprises remaining portions of conductive film 206, conductive film 402, and conductive film 202, in electrical contact with each other, and dielectric film 204.

Figure 6:
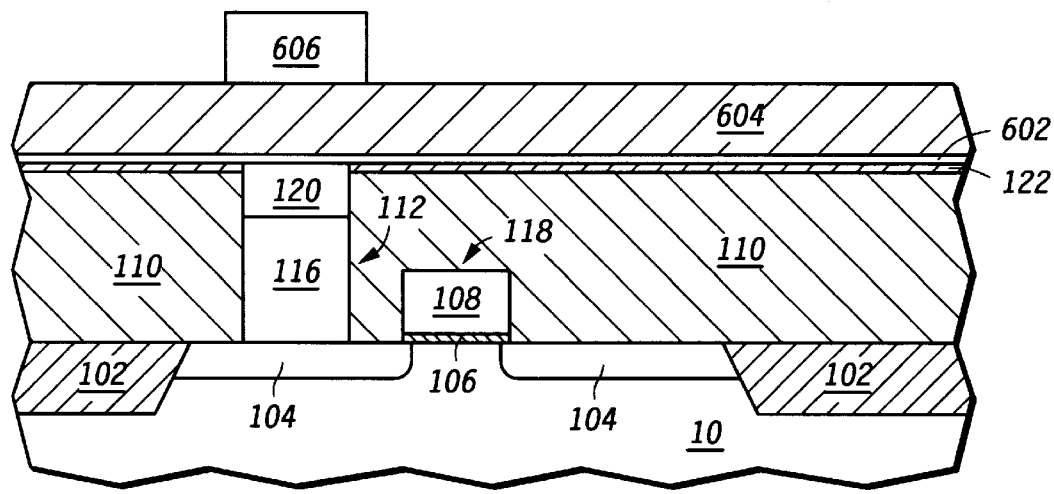
FIGS. 6–9 include an illustration of cross-sectional views of sucessive steps of the method of forming a capacitor according to a second embodiment of the present invention.

FIGS. 6–9 illustrate an alternate embodiment of the present invention. FIG. 6 illustrates the partially processed semiconductor device substrate shown in FIG. 1, and further includes a conductive film 602, a dielectric film 604, and a photoresist layer 606 overlying the substrate. The processes and materials used to form the conductive film 602 and dielectric film 604 are similar to those discussed previously to form conductive film 202 and dielectric film 204. Conductive film 602 is formed in a range of approximately 20–50 nanometers in thickness. Dielectric film 604 is formed in a range of approximately 200 to 500 nanometers in thickness. Overlying the dielectric film 604 is a photoresist layer 606. Photoresist layer 606 is patterned to define a portion of a bottom electrode of a capacitor.

Figure 7:
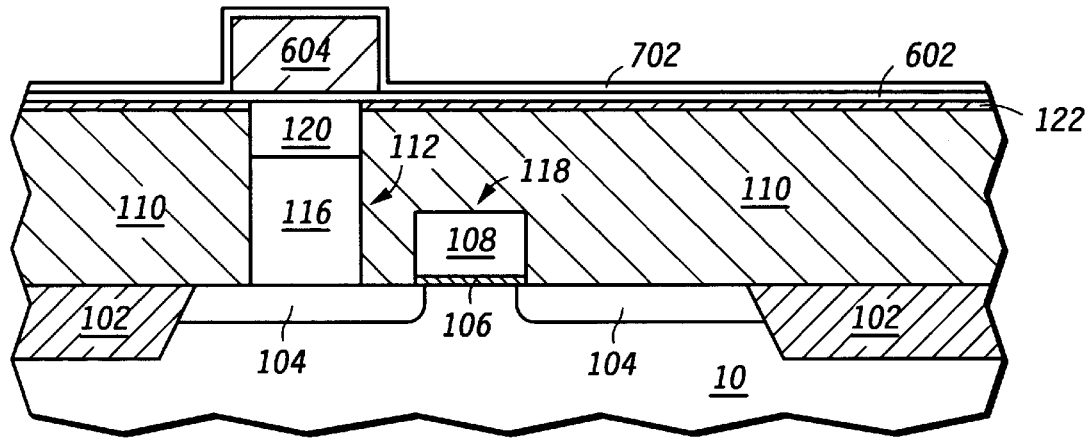

FIG. 7 further illustrates the semiconductor device of FIG. 6 after etching dielectric film 604 and then depositing a conductive film 702. Dielectric film 604 is etched using a conventional oxide etch processing chemistry. The etch is terminated upon removal of unpatterned portions of dielectric film 604 and exposure of underlying conductive film 602, as illustrated in FIG. 7. Conductive film 702 is formed using materials and processes similar to those previously described to form conductive film 202. The thickness of conductive film 702 is in a range of approximately 10 to 50 nanometers.

Figure 8:
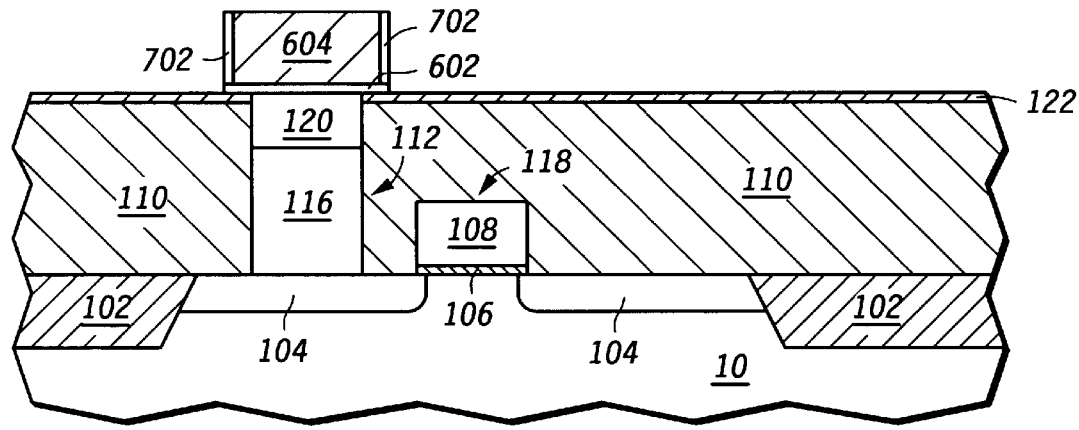

In FIG. 8, portions of conductive film 702 and conductive film 602 have been removed using conventional anisotropic etch processing. The overall time of the etch process is such that portions of conductive film 602 remain on the sidewalls of the dielectric film 604 after completing the etch. Those of ordinary skill in the art are capable of determining the appropriate overetch time for this processing step.

Figure 9:
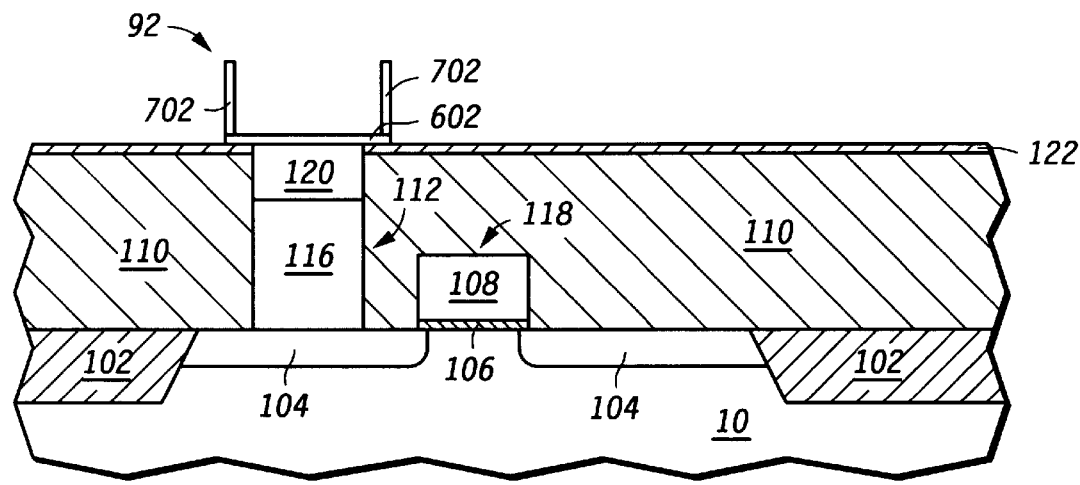

FIG. 9 further illustrates the structure shown in FIG. 8 after receiving conventional plasma or wet etch processing to completely remove remaining portions of dielectric film 604. During this etch step, adhesion/barrier layer 122 provides etch stop protection thereby preventing removal of dielectric film 110 during the etch. The resulting feature, in accordance with an embodiment of the present invention, is a crown bottom electrode capacitor structure 92, having a general U-shape, as illustrated in FIG. 9.

Figure 10:
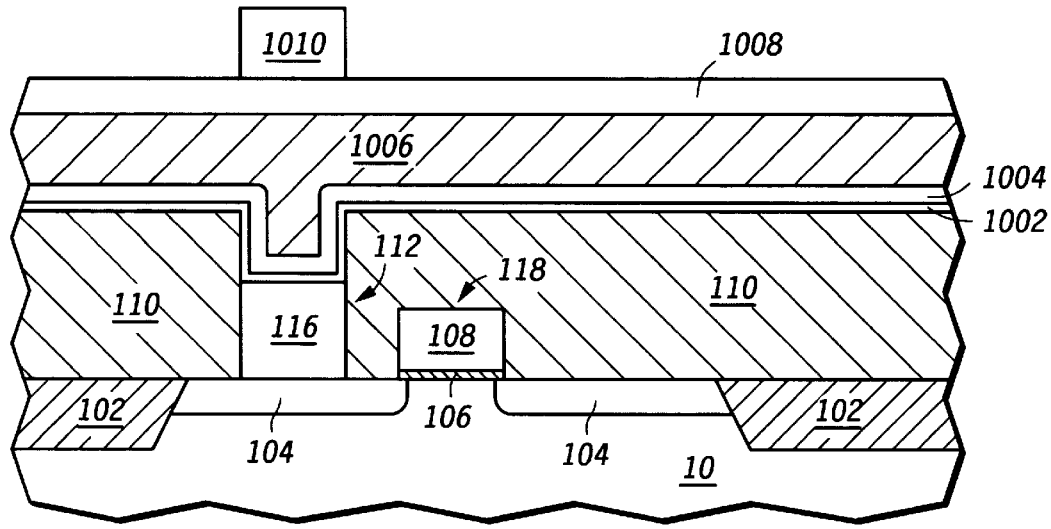
FIGS. 10–12 include an illustration of cross-sectional views of succssive steps of the method of forming a capacitor according to a third embodiment of the present invention.

FIGS. 10–13 illustrate an alternate embodiment of the present invention. FIG. 10 illustrates a semiconductor device substrate similar to the semiconductor device substrate illustrated in FIG. 1. However, instead of filling the contact with the oxygen barrier material 120 (shown in FIG. 1), an adhesion/barrier layer 1002 and an oxygen barrier conductive film (conductive liner) 1004 are formed overlying the substrate and within unfilled portions of contact opening 112, as illustrated in FIG. 10. Adhesion/barrier layer 1002 is formed using materials such as titanium/titanium nitride (Ti/TiN), tantalum/tantalum nitride (Ta/TaN), and the like. The adhesion/barrier layer 1002 is deposited using conventional sputtering techniques, and its thickness is in a in a range of approximately 20 to 40 nanometers.

Overlying adhesion/barrier layer 1002 is conductive film 1004. The thickness of conductive film 1004 is in a range of approximately 40–60 nanometers. The processes and materials used to form the conductive film 1004 are similar to those previously described to form conductive film 202. The conductive film 1004 is formed so as not to completely fill the contact opening 112. Overlying the conductive film 1004 is a dielectric material (dielectric film 1006). As illustrated in FIG. 10, the dielectric film 1006 completely fills the contact opening 112. The thickness of dielectric film 1006 is in a range of approximately 300 to 500 nanometers. The processes and materials used to form the dielectric film 1006 are similar to those previously described to form dielectric film 204.

Overlying the dielectric film 1006 is conductive film 1008. The thickness of conductive film 1008 is in a range of approximately 50 to 150 nanometers. The processes and materials used to form the conductive film 1008 are similar to those previously described to form the conductive film 202. Overlying conductive film 1008 is a photoresist layer 1010. Photoresist layer 1010 is patterned to define a feature that subsequently forms portions of a lower capacitor electrode.

Figure 11:
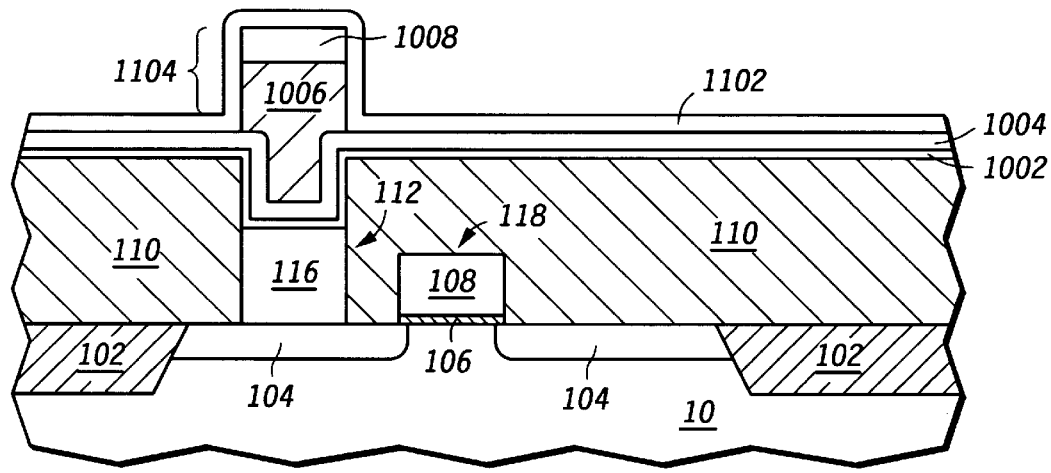

FIG. 11 includes the semiconductor device substrate cross-section of FIG. 10 and now shows that portions of the conductive film 1008 and the dielectric film 1006 have been etched to form a conductive cap overlying a dielectric post (post structure 1104), and further illustrates that a conductive film 1102 is deposited overlying conductive film 1004 and the post structure 1104. Removal of unpatterned portions of the conductive film 1008 and dielectric film 1006 can be accomplished using a multi-step etch process similar to the one previously described to etch conductive film 206 and dielectric film 204. The thickness of conductive film 1102 is in a range of approximately 20 to 50 nanometers. The processes and materials used to form the conductive film 1102 are similar to those used to form the conductive film 202 described previously.

Figure 12:
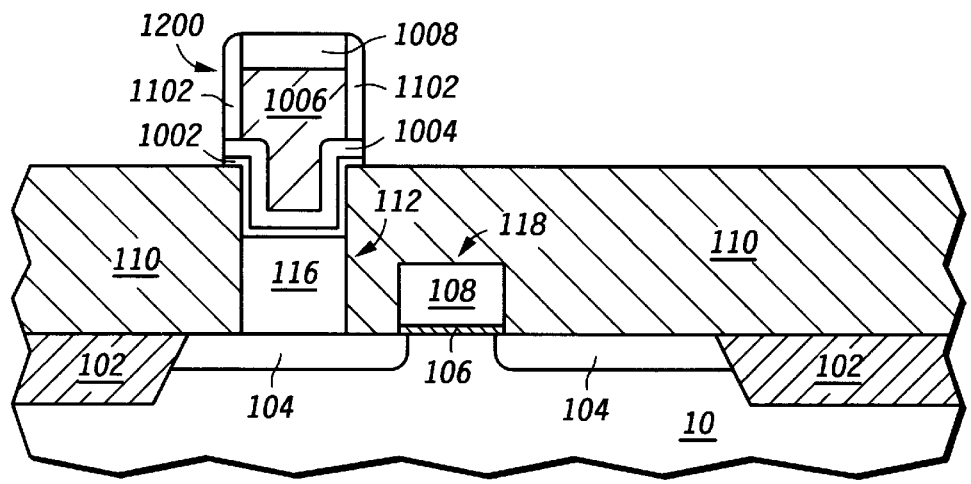

FIG. 12 illustrates the substrate in FIG. 11 after etching portions of conductive films 1102, 1008, 1004 and adhesion/barrier layer 1002 to form a bottom electrode 1200 of a capacitor. Conductive films 1102, 1008 and 1004 are etched using a conventional etch process similar to the one described previously to etch conductive films 402, 206, and 202. The etch time for this process can be adjusted to accommodate the additional removal of adhesion/barrier layer 1002. The etch process terminates upon removal of portions adhesion/barrier layer 1002 overlying dielectric film 110 as is illustrated in FIG. 12. The overall time of the etch process is such that portions of conductive film 1102 remain on the sidewalls of the dielectric film 1006 after completing the etch. Those of ordinary skill in the art are capable of determining the appropriate overetch time for this processing step. Additionally, the thickness of the conductive film 1008 is such that after completing the etch, approximately 30–100 nanometers of conductive film 1008 remains overlying the dielectric film 1006. Upon completion of the etch, the bottom electrode 1200 of a capacitor has been formed. The bottom electrode 1200 comprises remaining portions of adhesion/barrier layer 1002, conductive film 1004, conductive film 1102, conductive film 1008, and dielectric film 1006.

FIGS. 13–17 illustrate an embodiment of the present invention showing an alternate method for forming a capacitor electrode. As illustrated in FIGS. 13–17, the lower electrode of the capacitor has been misaligned off-center from the conductive plug to illustrate a potential benefit of this embodiment in situations where the patterning alignment would otherwise produce trenching of dielectric within the plug.

Figure 13:
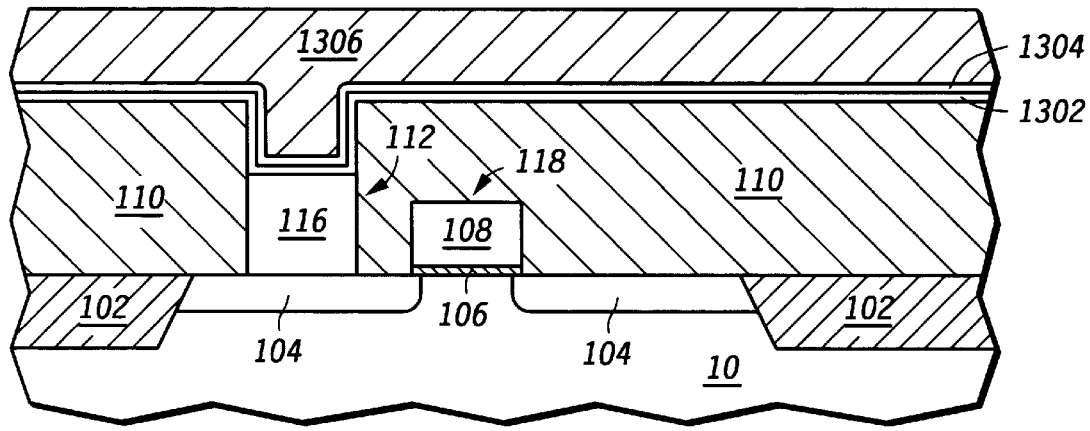
FIGS. 13–17 include an illustration of cross-sectional views of successive steps of the method of forming a capacitor according to a fourth embodiment of the present invention.

FIG. 13 illustrates a semiconductor device substrate similar to the semiconductor device substrate illustrated in FIG. 1. However, instead of filling the contact with the oxygen barrier material 120 (shown in FIG. 1), an adhesion/barrier layer 1302 and a conductive film 1304 are formed overlying the substrate and within unfilled portions of contact opening 112 as illustrated in FIG. 13. Adhesion/barrier layer 1302 is formed using materials such a titanium/titanium nitride (Ti/TiN), tantalum/tantalum nitride (Ta/TaN), and the like. The adhesion/barrier layer 1302 is deposited using conventional sputtering techniques and its thickness is in a in a range of approximately 20 to 40 nanometers.

Overlying adhesion/barrier layer 1002 is a conductive film 1304. The thickness of conductive film 1304 is in a range of approximately 40–60 nanometers. The processes and materials used to form the conductive film 1304 are similar to those previously described to form conductive film 202. The conductive film 1304 is formed so as not to completely fill the contact opening 112. Overlying the conductive film 1304 is a dielectric film 1306. The thickness of the dielectric film 1306 is in a range of approximately 300 to 500 nanometers. The processes and materials used to form the dielectric film 1306 are similar to those previously described to form dielectric film 204.

Figure 14:
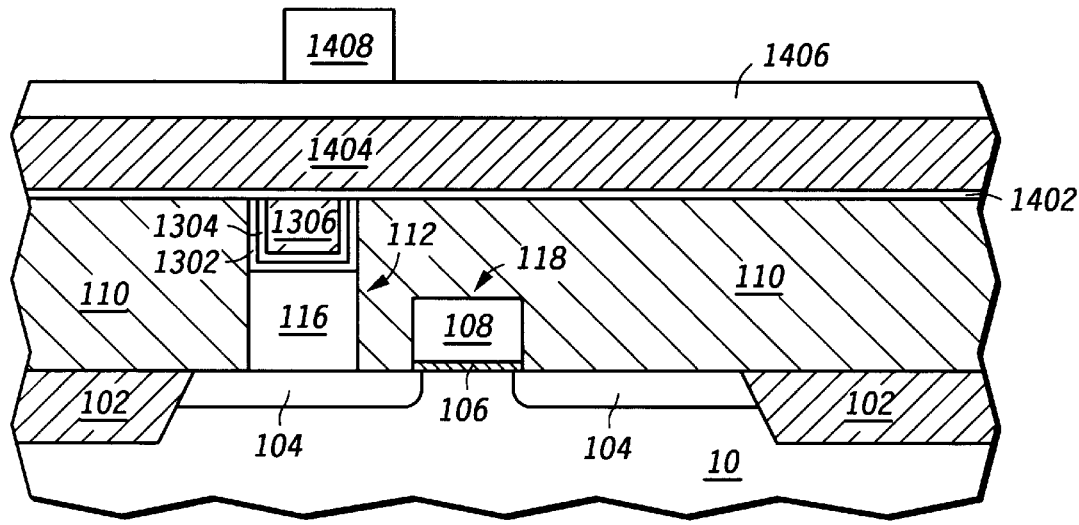

FIG. 14 further illustrates the cross-section of the semiconductor device substrate in FIG. 13 after removing portions of adhesion/barrier layer 1302, conductive film 1304, and dielectric film 1306. FIG. 14 additionally includes a conductive film 1402, a dielectric film 1404, a conductive film 1406, and a patterned photoresist layer 1408 overlying the semiconductor device substrate.

Prior to depositing the conductive film 1402, portions of the dielectric film 1306, the conductive film 1304, and the adhesion/barrier layer 1302, not contained within contact opening 112, are removed using a conventional plasma etch or CMP process. Conductive film 1402 is then formed over the surface using materials and processes similar to those described previously to form conductive film 202. The thickness of conductive film 1402 is in a range of approximately 15–25 nanometers.

Overlying conductive film 1402 is a dielectric film 1404, conductive film 1406, and patterned photoresist layer 1408. The thickness of dielectric film 1404 is in a range of approximately 200 to 500 nanometers. The thickness of conductive film 1406 is in a range of approximately 50 to 100 nanometers. The processes and materials used to form the dielectric film 1404 and conductive film 1406 are similar to those described previously to form conductive film 202 and dielectric film 204.

Figure 15:
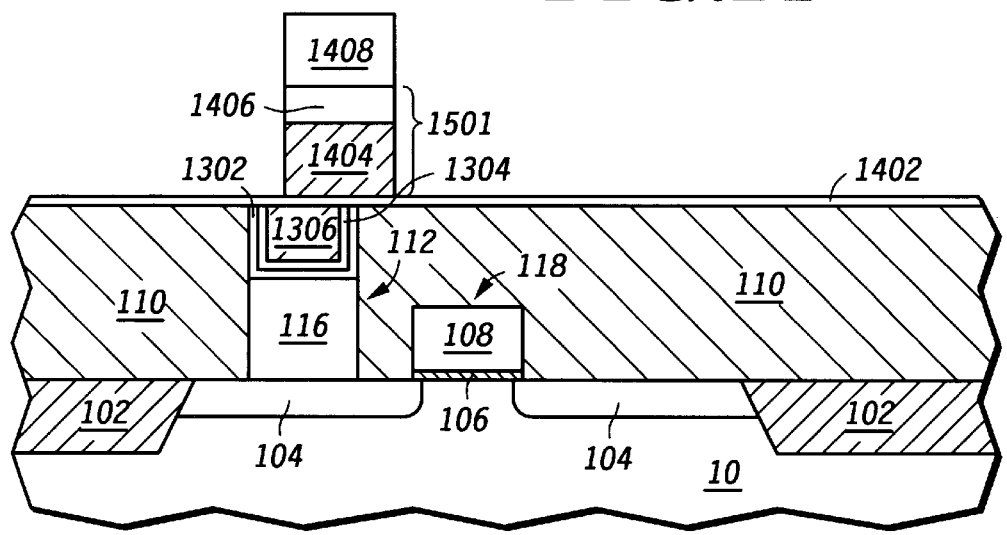

In FIG. 15, portions of conductive film 1406 and the dielectric film 1404 have been etched to form a post structure 1501. The etch to define the post structure 1501 is similar to the etch described previously to form the post structure 302, shown in FIG. 3. In accordance with an embodiment of the present invention, the conductive film 1402 protects underlying dielectric film 1306 and prevents trenching during the overetch to define the post structure 1501. As illustrated in FIG. 15, the alignment of the patterned photoresist layer is such that if the conductive film 1402 were not present, then during the overetch process, the dielectric film 1306 would be exposed to etchants during the etching process.

Figure 16:
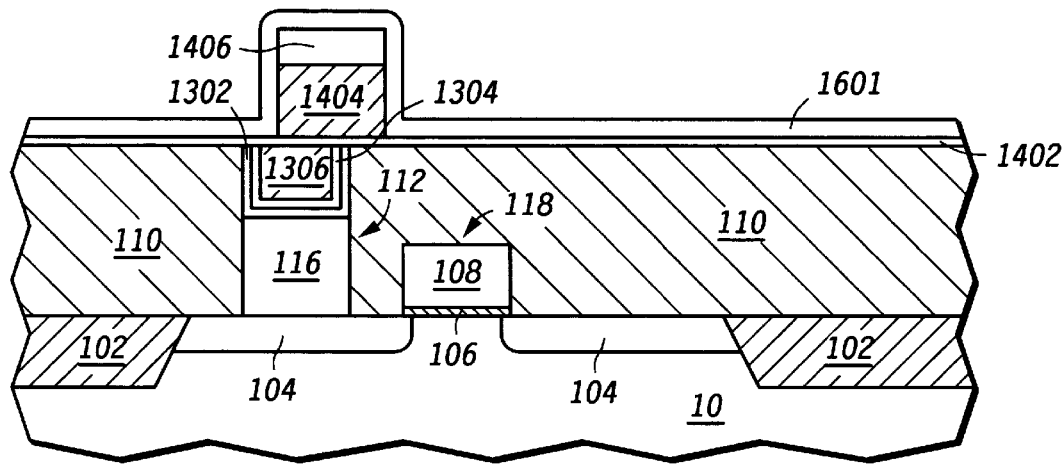

FIG. 16 further includes a conductive film 1601 formed overlying portions of conductive film 1402 and the post structure 1501. The thickness of conductive film 1601 is in a range of approximately 20 to 50 nanometers. Conductive film 1601 is formed using materials and processes similar to those described previously to form conductive film 202.

Figure 17:
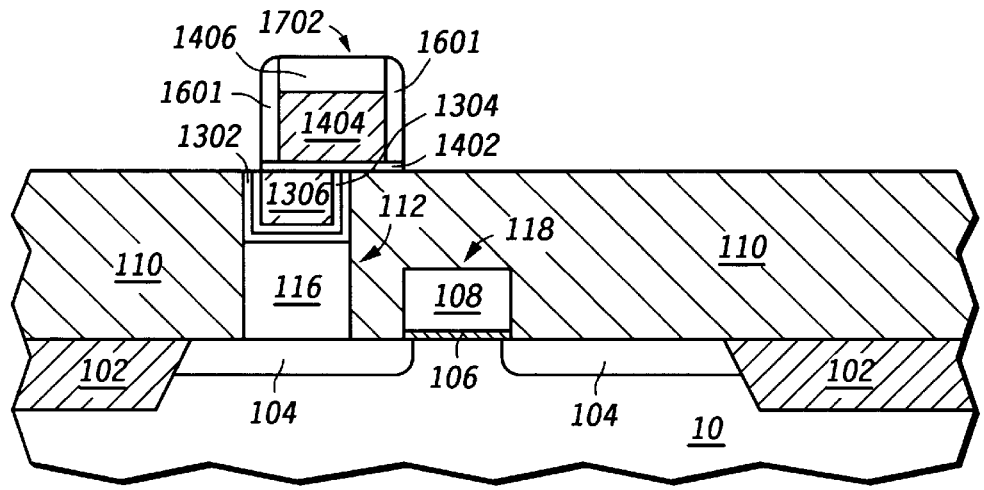

In FIG. 17, portions of conductive films 1601, 1406 and 1402 have been removed to form an electrode 1702. Conductive films 1601, 1406 and 1402 are etched using a conventional etch process that terminates upon exposure of portions of dielectric film 110. The etch process is similar to the one described previously to etch conductive films 402, 206, and 202. The overall time of the etch process is such that portions of conductive film 1601 remain on the sidewalls of the post structure 1501 after completing the etch. Those of ordinary skill in the art are capable of determining the appropriate overetch time for this processing step. In addition, the thickness of the conductive film 1406 is such that approximately 30–100 nanometers of conductive film 1406 remains overlying the dielectric film 1404 after completing the etch. Upon completion of the etch, an electrode 1702 of a capacitor has been formed. As illustrated in FIG. 17, the electrode 1702 comprises remaining portions of adhesion/barrier layer 1302, conductive film 1304, dielectric film 1306, conductive film 1402, conductive film 1406, conductive film 1601, and dielectric film 1404.

Figure 18:
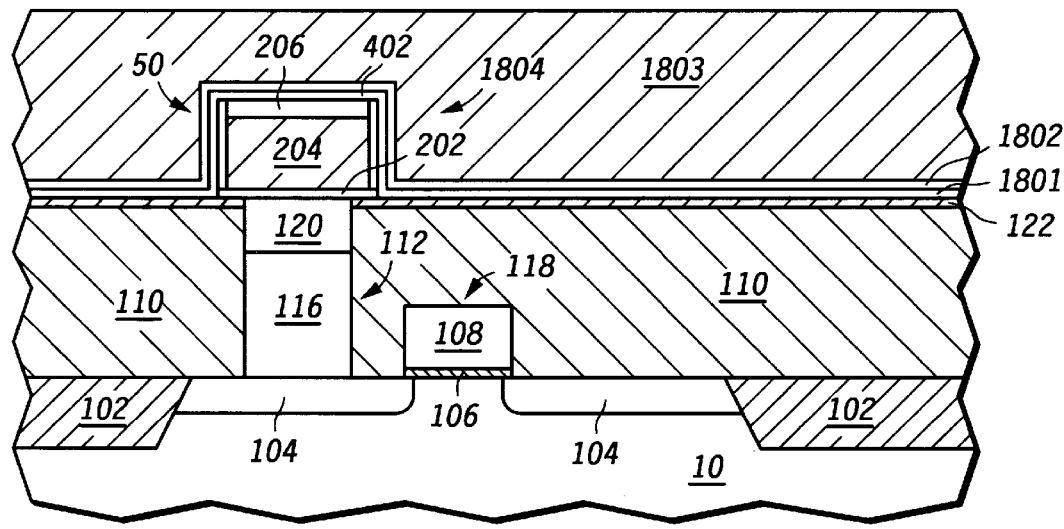
FIG. 18 includes an illustration of a cross-sectional view of the substrate of FIG. 5 after forming a substantially completed semiconductor device DRAM bit cell.

FIG. 18 further illustrates a cross-section of the embodiment previously illustrated in FIG. 5 and further includes elements that form a capacitor. Overlying the adhesion/barrier layer 122 and the electrode 50, illustrated in FIG. 18, is a capacitor dielectric film 1801. The capacitor dielectric film 1801 is a high-k dielectric formed using a deposition method that can include CVD, sputter deposition, or the like. For the purposes of this specification, a high-k dielectric material is one having a dielectric constant greater than approximately 10.0. The capacitor dielectric film 1801 may be composed of barium strontium titanate (BST), barium titanate (BTO), strontium titanate (STO), lead titanate (PT), lead zirconate (PZ), lead zirconate titanate (PZT), lead lanthanum zirconate titanate (PLZT), strontium bismuth tantalate (SBT), strontium bismuth niobate (SBN), or strontium bismuth niobate tantalate (SBNT). Preferably for DRAM applications the capacitor dielectric film 1801 includes atoms of barium, strontium, or titanium.

Overlying the capacitor dielectric film 1801 is a conductive film 1802. Conductive film 1802 forms the upper capacitor electrode. Conductive film 1802 is formed using processes and materials similar to those described previously to form conductive film 202. The two capacitor electrodes, 50 and 1802, can include the same or different conductive materials.

Overlying conductive film 1802 is an insulating layer 1803. The combination of the conductive film 1802, the capacitor dielectric film 1801, and the lower electrode 50 forms a capacitor 1804. The combination of the transistor 118, oxygen barrier material 120 and conductive fill material 116 (the storage node), and the capacitor 1804 forms a typical dynamic random access memory (DRAM) bit cell. Other electrical connections may be made but are not shown in FIG. 18. Also, other ILD layers and interconnect levels may be used if necessary to form a more complicated semiconductor device.

It is noted that FIG. 18 includes a device having a completed capacitor structure according to the bottom electrode configuration shown in FIG. 5. However, capacitor structures may also be completed similarly for the bottom electrode configurations illustrated in FIG. 9, FIG. 12, and FIG. 16 by subsequently depositing the appropriate capacitor dielectric, top electrode, and ILD layers.

Methods for depositing and etching dielectrics are known in the art. Embodiments of the present invention make use of depositing and etching dielectrics in combination with depositing and etching conductive films to form capacitor electrodes. In the prior art, one currently used method for increasing the surface area of a three-dimensional capacitor electrode includes increasing the thickness of the conductive material used to form the electrode. Increasing the conductive material's thickness makes etching the electrode more complicated and difficult.

Using embodiments of the present invention, the surface area and geometry of a three-dimensional capacitor electrode is preferentially and accurately controlled by first depositing a predetermined thickness of dielectric, patterning and etching it, and then forming a thin conductive material overlying the dielectric. Using the dielectric thickness to determine the height of the electrode allows the use of a thinner conductive electrode material without experiencing a reduction in surface area of the electrode or performance of the capacitor.

Advantages of using this combination include the ability to use thinner conductive materials to form electrodes having larger overall surface area. The thinner conductive materials are inherently easier to etch. This becomes increasingly important as the aspect ratio of the capacitor structures increase. Also, the etch to define the capacitor electrode does not require patterning. Instead, feature size and spacing is determined by patterning and etching of the dielectric posts. The conductive material that is deposited along the dielectric post's sidewalls reduces the spacing between the electrodes beyond that of the original spacing between successive dielectric post structures. Additional benefits include a reduction in the amount of conductive material and cost to form the electrode. Thus it is apparent that there has been provided, in accordance with embodiments of the present invention, a capacitor electrode structure and a process for forming it, that provide advantages over the prior art.

In the foregoing specification, the invention has been described with reference to specific embodiments. However, one or ordinary skill in the art appreciates that various modifications and changes can be made without departing from the skill of the present invention as set forth in the claims below. Accordingly, the specification and figures are to be regarded in an illustrative rather than a restrictive sense, and all such modifications are intended to be included within the scope of the present invention. In the claims, means plus function clauses if any cover the structures described herein that perform the recited functions. The means plus function clauses also cover structural equivalents and equivalent structures that perform the recited functions.

What is claimed is:

1. A method for forming a semiconductor device, comprising the steps of:
    forming a first dielectric film overlying a semiconductor device substrate;
    forming a first conductive film over the first dielectric film;
    forming a second dielectric film over the first conductive film;
    patterning the second conductive film to define a patterned area and an unpatterned area;
    removing the unpatterned area to define a portion of a post, wherein the post has a top surface that includes a remaining portion of the second conductive film, sidewalls that include a remaining portion of the second dielectric layer, and a bottom portion that includes a portion of the first conductive film formed under said remaining portion of the second dielectric layer;
    forming a third conductive film overlying the top surface and along the sidewalls of the post and overlying exposed surfaces adjacent the post; removing portions of the third conductive film overlying the top surface and overlying the exposed surfaces adjacent the portion of the post, wherein portions of the first conductive film overlying exposed surfaces adjacent the post are also removed and after removing portions of the third conductive film, a remaining portion of the third conductive film is disposed along sidewalls of the post and electrically connects said remaining portion of the second conductive film with a remaining portion of the first conductive film and forms at least part of a lower electrode;
    depositing a capacitor dielectric film over the post; and
    depositing an upper electrode on the capacitor dielectric film.

2. The method of claim 1, wherein the first dielectric film has a recess, the first conductive film extends into the recess, and a portion of the dielectric post fills the recess.

3. The method of claim 2, wherein the recess further contains a conductive plug over which said dielectric post is formed, said portion of the first dielectric film providing an oxygen barrier.

4. The method of claim 1, wherein the first dielectric film has a recess over which the dielectric post is formed, the recess containing an oxygen barrier.

5. The method of claim 4, wherein the oxygen barrier includes a material selected from a group consisting of iridium and ruthenium.

6. The method of claim 4, wherein the oxygen barrier includes a material selected from a group consisting iridium oxide, ruthenium oxide, titanium nitride, titanium aluminum nitride, titanium silicon nitride, tantalum nitride, tantalum aluminum nitride, tantalum silicon nitride, metal nitrides, metal borides and metal carbides.

7. The method of claim 4, wherein the oxygen barrier comprises a conductive liner that lines the recess and a dielectric material that fills the recess, said conductive liner includes a material selected from a group consisting of iridium and ruthenium.

8. The method of claim 4, wherein the oxygen barrier comprises a conductive liner that lines the recess and a dielectric material that fills the recess, said conductive liner includes a material selected from a group consisting of iridium oxide, ruthenium oxide, titanium nitride, titanium aluminum nitride, titanium silicon nitride, tantalum nitride, tantalum aluminum nitride, tantalum silicon nitride, metal nitrides, metal borides, and metal carbides.

9. The method of claim 4, wherein the recess further contains a conductive plug, wherein the oxygen barrier overlies the conductive plug and the conductive plug is in electrical contact with the first conductive film through the oxygen barrier.

10. The method of claim 9, wherein the conductive plug includes a material selected from a group consisting of tungsten and polysilicon.

11. The method of claim 1, wherein the second dielectric film comprises a material from a group consisting of silicon oxide, silicon nitride, and silicon oxynitride.

12. The method of claim 1, wherein the lower electrode comprises iridium.

13. The method of claim 1, wherein the lower electrode includes a material selected from a group consisting of platinum, palladium, ruthenium, rhenium, rhodium and osmium.

14. The method of claim 1, wherein the upper electrode includes a material selected from a group consisting of iridium, platinum, palladium, ruthenium, rhenium, rhodium and osmium.

15. The method of claim 1, wherein the capacitor dielectric film comprises a dielectric material having a dielectric constant of at least 10.

16. The method of claim 1, wherein the capacitor dielectric film comprises a dielectric material having a dielectric constant of at least 50.

17. The method of claim 9 wherein the first conductive film includes the oxygen barrier.

* * * * *